(12) United States Patent
Yokouchi

(10) Patent No.: US 7,329,481 B2
(45) Date of Patent: Feb. 12, 2008

(54) SUBSTRATE OPTICAL WAVEGUIDES HAVING FIBER-LIKE SHAPE AND METHODS OF MAKING THE SAME

(75) Inventor: Kishio Yokouchi, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 440 days.

(21) Appl. No.: 10/763,523

(22) Filed: Jan. 23, 2004

(65) Prior Publication Data
US 2005/0164131 A1 Jul. 28, 2005

(51) Int. Cl.
*G02B 6/10* (2006.01)
(52) U.S. Cl. ................................ 430/321; 430/396
(58) Field of Classification Search ................ None
See application file for complete search history.

(56) References Cited

U.S. PATENT DOCUMENTS

| 5,480,764 | A * | 1/1996 | Gal et al. ............. 430/321 |
|---|---|---|---|
| 6,343,171 | B1 | 1/2002 | Yoshimura et al. |
| 6,400,855 | B1 | 6/2002 | Li et al. |
| 6,504,966 | B2 | 1/2003 | Kato et al. |
| 6,603,915 | B2 | 8/2003 | Glebov et al. |
| 6,611,635 | B1 | 8/2003 | Yoshimura et al. |
| 6,690,845 | B1 | 2/2004 | Yoshimura et al. |
| 6,823,097 | B2 | 11/2004 | Glebov et al. |
| 6,828,606 | B2 | 12/2004 | Glebov |
| 2002/0114556 | A1 | 8/2002 | Kato et al. |
| 2003/0035614 | A1 | 2/2003 | Glebov et al. |
| 2003/0035632 | A1 | 2/2003 | Glebov et al. |
| 2003/0103712 | A1 | 6/2003 | Glebov et al. |
| 2003/0202732 | A1 | 10/2003 | Glebov et al. |
| 2003/0203315 | A1 * | 10/2003 | Farahi et al. ............. 430/296 |
| 2003/0206675 | A1 | 11/2003 | Glebov et al. |
| 2004/0028316 | A1 | 2/2004 | Yokouchi |
| 2004/0126056 | A1 | 7/2004 | Aoki et al. |
| 2004/0126079 | A1 | 7/2004 | Aoki et al. |
| 2004/0206988 | A1 | 10/2004 | Glebov |

OTHER PUBLICATIONS

L. Dalton, et al., "Polymeric Electro-optic Modulators: From Chromophore Design to Integration with Semiconductor Very Large Scale Integration Electronics and Silica Fiber Optics," Ind. Eng. Chem. Res., Jan. 1999, pp. 8-33, vol. 38, No. 1.
S. Garner, et al., "Three-Dimensional Integrated Optics Using Polymers IEEE Journal of Quantum Electronics," Aug. 1999, pp. 1146-1155, vol. 35, No. 8.
Glebov, et al., "Two-dimensional microlens arrays in silica-on-silicon planar lightwave circuit technology," J. Microlith., Microfab., Microsyst., Oct. 2003, pp. 309-318, vol. 2 No. 4.

* cited by examiner

*Primary Examiner*—John A. McPherson
(74) *Attorney, Agent, or Firm*—Baker Botts L.L.P.

(57) ABSTRACT

Substrate optical waveguides having curved major surfaces and methods for making the same are disclosed. In one exemplary embodiment, a photosensitive cladding layer is pattern exposed to actinic radiation through a first gray-scale mask and subsequently developed to define a groove therein having a curved major bottom surface. A layer of photosensitive core material is thereafter formed over the groove, pattern exposed to actinic radiation through a second gray-scale mask, and subsequently developed to define a core element. The core element is disposed within the groove and has a curved major bottom surface and a curved major top surface.

30 Claims, 5 Drawing Sheets

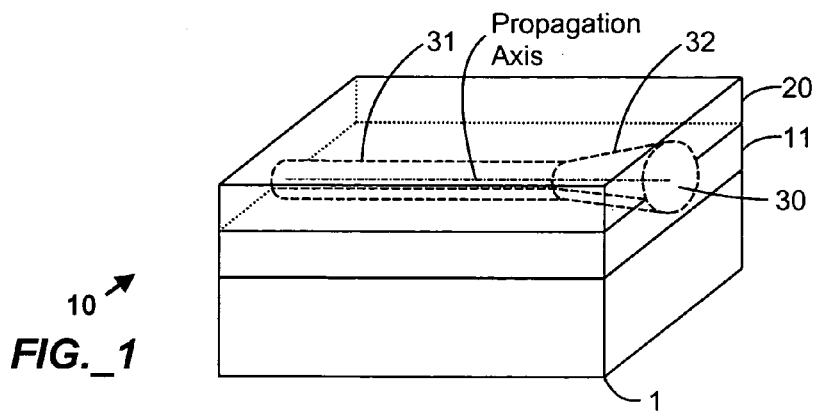
FIG._1
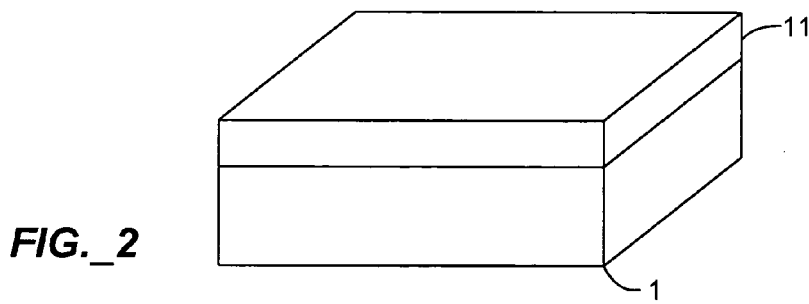
FIG._2
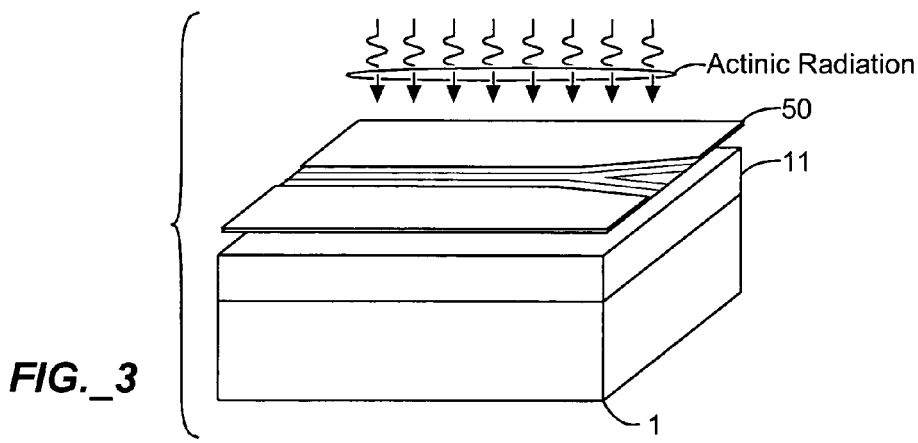
FIG._3
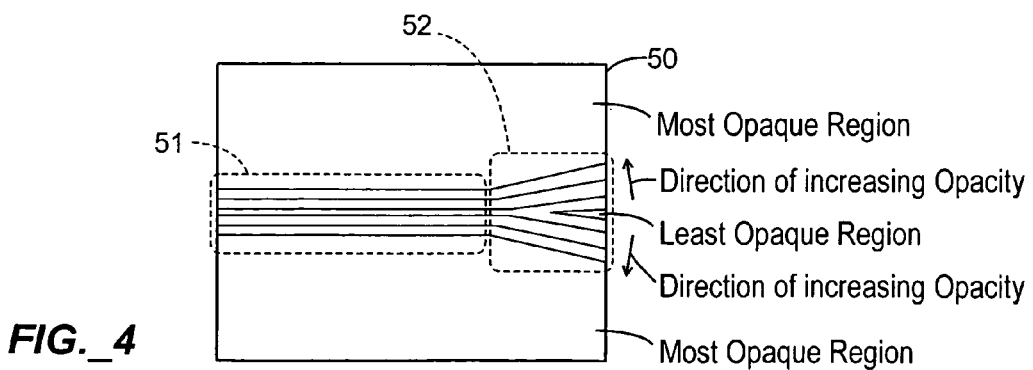
FIG._4

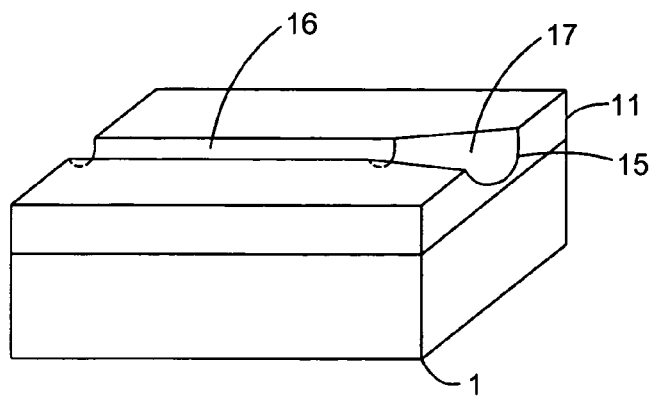
FIG._5
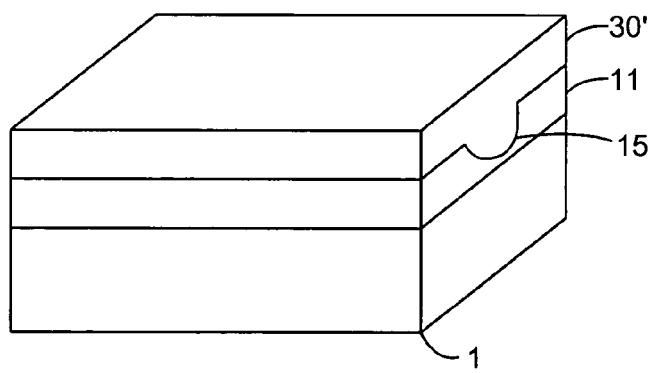
FIG._6
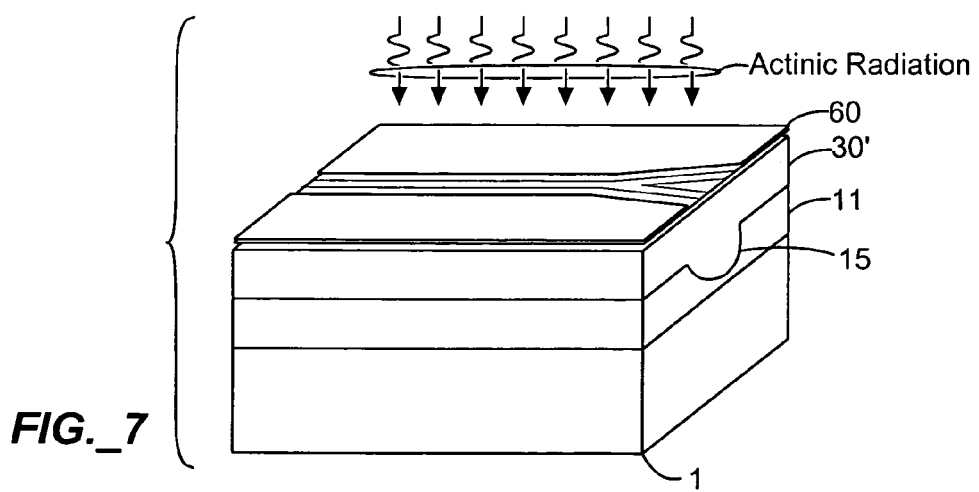
FIG._7

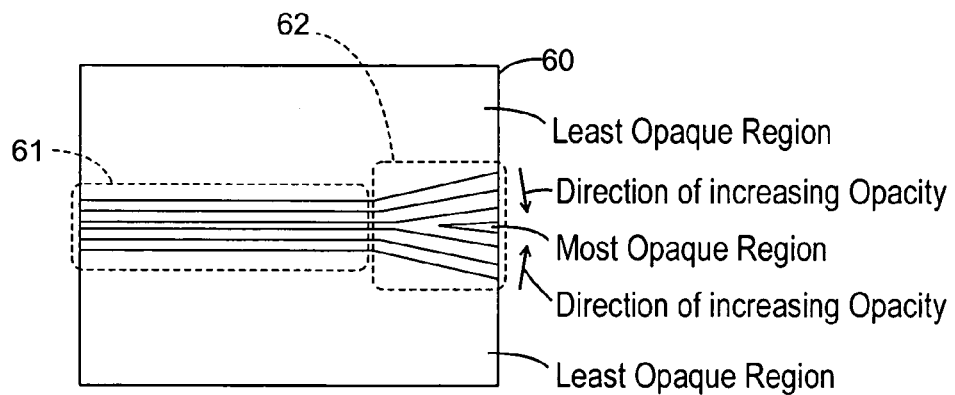
FIG._8
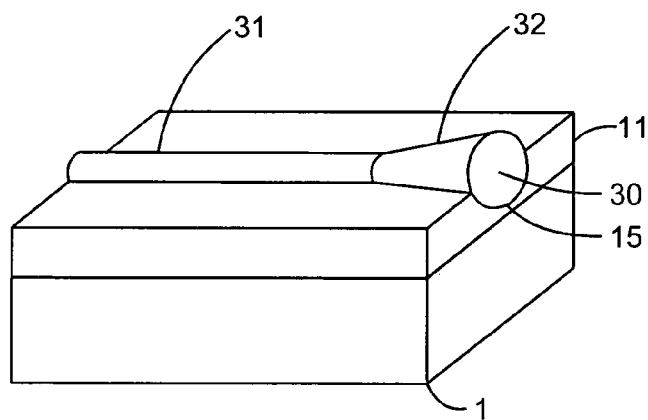
FIG._9
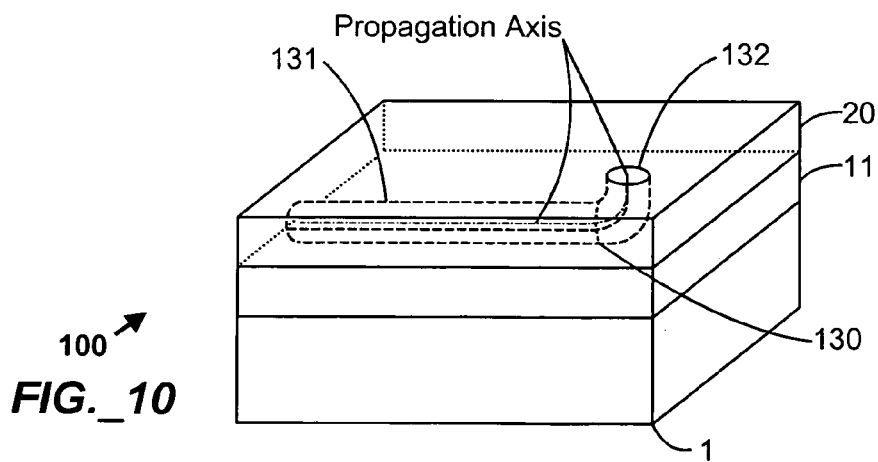
FIG._10

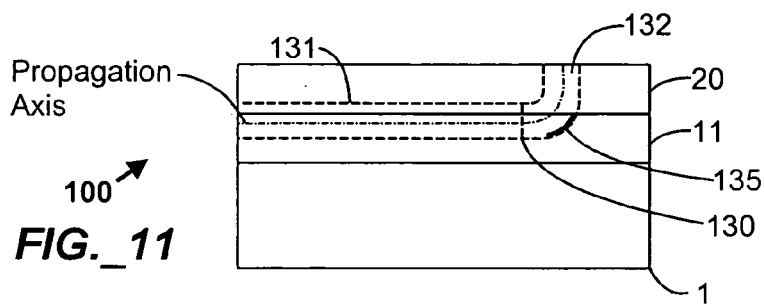
FIG._11
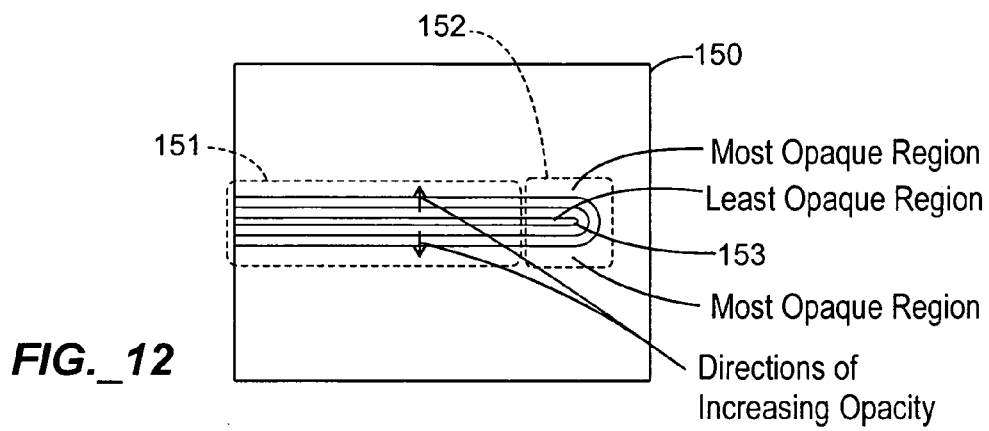
FIG._12
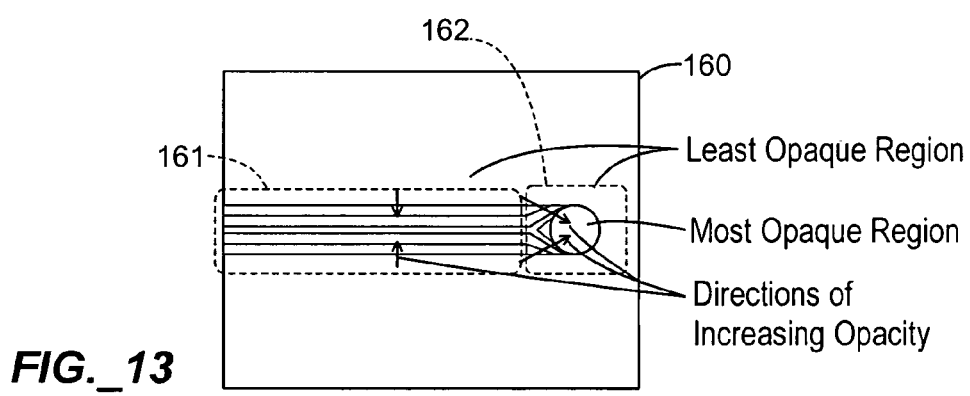
FIG._13
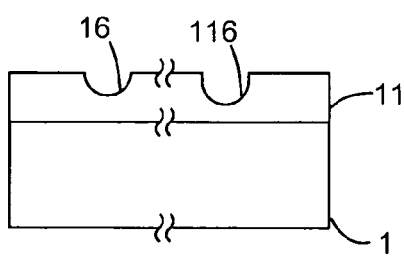
FIG._14
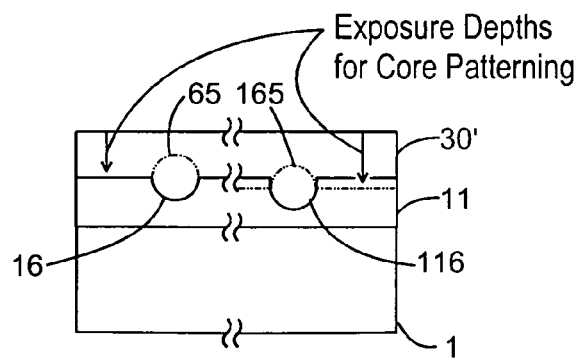
FIG._15

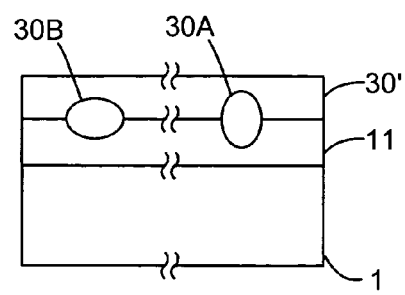
FIG._16
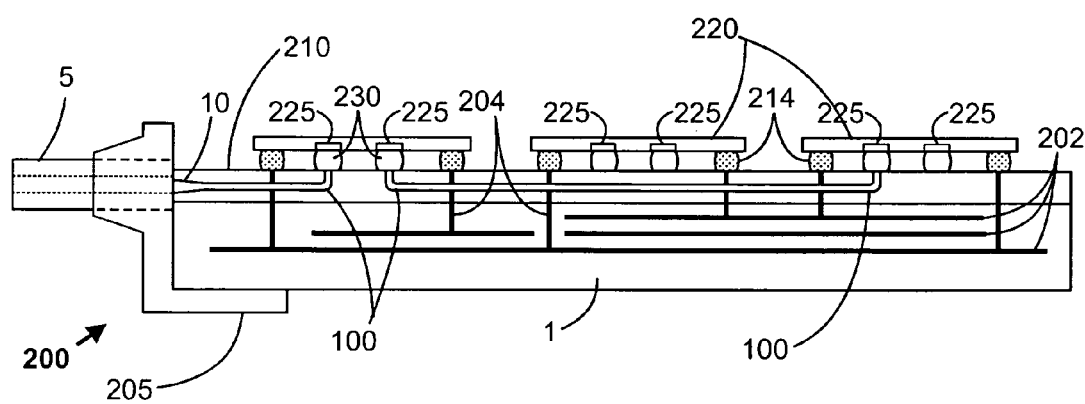
FIG._17

SUBSTRATE OPTICAL WAVEGUIDES HAVING FIBER-LIKE SHAPE AND METHODS OF MAKING THE SAME

FIELD OF THE INVENTION

The present invention relates to optical waveguides formed on planar substrates, such as integrated circuit substrates, and methods of making the same, and more particularly to such optical waveguides having fiber-like shapes.

BACKGROUND OF THE INVENTION

In the art of planar waveguide circuit substrates, optical waveguides can be formed along with opto-electronic components and/or electrical traces in an effort to reduce signal propagation times across the circuit boards of electronic systems and, in some cases, across integrated circuit chips. As an example, consider an opto-electronic interconnect board intended to electrically connect several integrated-circuit (IC) chips together as a system. There would often be a need in such a system to convey an electrical signal from an IC chip at one end of the board to another IC chip at the opposite end of the board, with a distance of perhaps tens of centimeters between the two IC chips. A conventional electrical signal trace formed in the interconnect board, configured to electrically connect these two IC chips, would have a large amount of resistance and capacitance, and thus would have a large propagation delay. In theory, an optical connection between these two IC chips would not have such a large delay. For such an optical connection, an opto-electric conversion device (e.g., VCSEL or light modulator) may be positioned under one IC chip and electrically connected thereto, another opto-electric conversion device (e.g., photodetector) may be positioned under the other IC chip and electrically connected thereto, and an optical waveguide may be formed between the two opto-electric conversion devices. The optical waveguide comprises a strip of core material, with a square or rectangular transverse cross-section, disposed between two cladding layers.

The performance of such substrate optical transmission systems has not met the full desired expectations, and there is a recognition in the art for improvement of these systems. The distance over which signals can be reliably transmitted is less than desired, and the amount of power required to transmit the optical signal is greater than desired. Current research is focused on improving the opto-electric conversion devices, and their integration onto the substrate. The current view in the art is that improvements will address the less-than-desired performance of these systems.

SUMMARY OF THE INVENTION

As part of making his invention, the inventor has recognized that the cross-sectional shape of the core element of a substrate waveguide is square or rectangular, and he has found that this shape introduces a polarization-dependent loss in the transmission of light through the waveguide. Specifically, the distance from the center of the waveguide to a far corner of the waveguide is significantly larger than the distance from the center to a side (being 1.4 times larger for a square core, and even larger for a rectangular core), and this difference creates a polarization-dependent loss in the transmission of light in the waveguide.

The inventor has also recognized that many substrate-waveguide applications require the incorporation of 45-degree mirror structures at the ends of some waveguides in order to direct the light out of the substrate in a vertical direction (in other words, change the propagation direction from being horizontal to the surface to being vertical to the surface). As part of making another aspect of his invention, the inventor has found that mirror structures have optical divergences that introduce additional transmission losses, particularly for rectangular and square cores where the above-noted polarization-loss effects have occurred.

The inventor has discovered that these losses can be addressed by replacing the square and rectangular cores with cores having circular or oval-shaped cross-sections, and by using an elbow-bend segment of core material in place of a 45-degree mirror.

The present invention is directed to these structures and to methods of making them. Exemplary methods according to the present invention comprise forming a lower cladding layer of photosensitive material, exposing the cladding layer to actinic radiation through a first gray-scale mask instead of a conventional "binary" mask, and developing the exposed pattern to form a groove located in the lower cladding layer and having three-dimensional features. The exemplary methods further comprise forming a core layer of photosensitive material over the groove and the remaining portions of the lower cladding layer, exposing the core layer to actinic radiation through a second gray-scale mask, and developing the exposed pattern to form an element of core material located in and over the groove, and having three-dimensional features. An upper cladding layer may then be formed over the core element and lower cladding layer.

Accordingly, it is an object of the present invention to provide waveguide core elements that have three-dimensional features and methods for making the same.

It is a further object of the present invention to provide waveguide core elements that have circular or oval-shaped transverse cross-sections and methods for making the same.

It is yet another object of the present invention to provide waveguide core elements that have elbow-bend segments and methods for making the same.

These and other objects of the present invention will become clear to one of ordinary skill in that art after a review of the present application.

BRIEF DESCRIPTION OF THE DRAWINGS

FIG. 1 shows a perspective view of a first waveguide structure according to the present invention.

FIGS. 2-9 show views of the first waveguide structure during various stages of fabrication according to the present invention, with FIGS. 4 and 8 showing top plan views of exemplary gray-scale masks according to the present invention.

FIG. 10 shows a perspective view of a second waveguide structure according to the present invention.

FIG. 11 shows a cross-sectional view of the second waveguide structure shown in FIG. 10 according to the present invention.

FIGS. 12 and 13 show top-plan views exemplary gray-scale masks which may be used in the construction of the second waveguide structure shown in FIGS. 10-11 according to the present invention.

FIG. 14 shows a first cross-sectional comparison of the first and second exemplary waveguide structures showing grooves according to the present invention.

FIG. 15 shows a second cross-sectional comparison of the first and second exemplary waveguide structures showing the three-dimensional penetration depth of actinic radiation through the second sets of gray-scale masks according to the present invention.

FIG. 16 shows cross-sections of exemplary waveguide structures having cores with oval transverse cross-sections according to the present invention.

FIG. 17 shows an exemplary electronic system incorporating the first and second exemplary waveguide structures according to the present invention.

DETAILED DESCRIPTION OF THE INVENTION

A first waveguide structure according to the present invention is shown at 10 in FIG. 1. Waveguide structure 10 is formed on a substrate 1 and comprises a lower cladding layer 11, a core element 30 partially embedded in lower cladding layer 11, and an upper cladding layer 20 which covers portions of core element 30. Waveguide structure 10 is generally designed to convey light having a wavelength in the range of approximately 700 nm to approximately 1600 nm (as measured in free space, so called "free-space wavelength"). Cladding layers 11 and 20 are optically transparent or semi-transparent at the desired operating wavelength, and have indices of refraction (n) which are equal or close to one another at the desired operating wavelength. Core element 30 is optically transparent or semi-transparent at the desired operating wavelength, and has an index of refraction which is greater than each of the indices of the cladding layers at the desired operating wavelength (preferably by a value of at least 0.02, preferably by a value of at least 0.05). A greater degree of optical transparency in the core element and cladding layers means that a lower degree of optical absorption occurs, which further means that the waveguide structure can conduct light over a greater distance. However, a high degree of transparency is not required when waveguide structure 10 is used to convey light over short distances.

As one exemplary embodiment, core element 30 comprises a first core segment 31 and a second core segment 32 optically coupled to first core segment 31. Each of core segments 31 and 32 has an elongated dimension along which light is to propagate (the "Propagation Axis"), and a circular or oval cross-section in plane that is transverse to the elongated dimension (and transverse to the propagation axis of the light). First core segment 31 has a substantially uniform transverse cross-section along the length of its elongated dimension. For example, in the case of a circular transverse cross-section, first core segment 31 may have a uniform diameter. Also, in the case of an oval transverse cross-section, first core segment 31 may have major and minor axes with substantially constant values along the elongated dimension. In either case, core segment 31 has a major top curved surface and a major bottom curved surface, and a lowermost depth into cladding layer 11 that lies between the top and bottom surfaces of cladding layer 11. Second core segment 32 has a transverse cross-section whose dimensions vary along the length of its elongated dimension. At its coupling point with first core segment 31, second core segment 32 has a cross-section that is substantially the same as that of first core segment 31. However, the dimensions (and area) of the cross-section of second core segment 32 increase along the length of the second core segment 32 as one moves toward the right side face of the device, where core segment 32 exits the substrate. The increase in dimensions causes a flaring in the waveguide core, and this flaring is particularly useful for coupling the waveguide to an optical fiber, which has a core with a large transverse cross-section. The flaring eases the tolerances for alignment of the optical fiber to the waveguide, and increases coupling efficiency. Like core segment 31, core segment 32 has a major top curved surface and a major bottom curved surface, and a lowermost depth into cladding layer 11 that lies between the top and bottom surfaces of cladding layer 11.

The terms "lower cladding layer" and "upper cladding layer" used herein indicate that the lower cladding layer is formed before the upper cladding layer; the terms are not intended to imply any specific orientation of the layers during the use of the waveguide structure since one may use the waveguide structure in any orientation.

Substrate 1 may comprise a single layer of material, or multiple layers of various materials, and may include such components as electrical traces, electrical vias, embedded electronic components and embedded opto-electronic components. In preferred embodiments, substrate 1 comprises an adhesion layer (sometimes called a coupling layer) immediately adjacent to lower cladding layer 11. The formation of such adhesion layers is well known to the art, and a description thereof is not needed herein for one of ordinary skill in the art to make and use the present invention.

FIGS. 2-9 illustrate exemplary methods of constructing waveguide structure 10. Starting with substrate 1, a first cladding layer 11 of a photosensitive cladding material is formed on substrate 1. As is known in the art, photosensitive polymer materials may be provided in the form of sheets of solid material with adhesive on one or both sides, or may be initially provided in a viscous form fluidized by one or more solvents, which can be referred to as the fluidized form of the material. The present invention may be practiced with either form. The fluidized form is currently preferred. Photosensitive polymer sheets may be applied by conventional lamination methods; lamination at reduced atmospheric pressures may be used when laminating onto existing sheets with fine features. After lamination, the photosensitive sheet is pattern exposed to actinic radiation, and then developed by a developer.

The fluidized photosensitive polymer materials are usually formed one the substrate by spin coating while in their fluidized form, the process of which achieves a substantially uniform thickness across the substrate. Other coating methods are possible. After coating on the substrate, the layer of fluidized material is soft-baked (heated to a low temperature compared to cure temperature of the material) to drive off the solvents, thereby leaving a solidified layer of the photosensitive material. The photosensitive material is then pattern exposed to actinic radiation, and then developed by a developer. If another fluidized polymer layer is to be subsequently formed over an existing polymer layer, the existing polymer layer is preferably treated to prevent the solvents of the subsequent layer from weakening or dissolving the existing layer. Such treatments are well-known in the art (e.g., partial curing of the layer), and description thereof is not needed to make and use the present invention.

The photosensitive cladding material, when in its solid form, is dissolvable in a developer (typically a water-based solution or a solvent different from the fluidizing solvent) at a rate that is a function of its exposure dosage to actinic radiation. There are several photosensitive cladding materials commercially available. Both negative type (also called "negative tone" and "negative image") and positive type (also called "positive tone" and "positive image") are available. As is well known in the art, a positive type photosensitive material is initially resistant to dissolving in the developer, but becomes more soluble in the developer solution as its exposure dosage to actinic radiation increases. In contrast, a negative type photosensitive material can initially be dissolved in the developer, but becomes more insoluble as its exposure dosage to actinic radiation increases. In both types, the solubility of the photosensitive material in its developer is a function of exposure dosage to actinic radiation. In the positive type, solubility is directly related to exposure dosage; in the negative type, solubility is inversely related to exposure dosage. As used herein, actinic radiation is any form of energy which initiates the desired change in solubility, and which can be selectively applied to a layer of the material. Typical forms of actinic radiation include ultraviolet light, deep ultraviolet light, electron beams, and X-rays. Ultraviolet light and deep ultraviolet light have wavelengths of less than 500 nm (as measured in free space).

Next, as illustrated in FIG. 3, photosensitive cladding layer 1 is exposed to actinic radiation through a gray-scale mask 50 (i.e., cladding layer 11 is patterned exposed to actinic radiation) in order to form a groove in which core element 30 will be later formed. The groove is to have a curved major surface (i.e., the majority of the groove's surface is curved), so that core element 30 will have a curved major bottom surface. For example, the groove may comprise a rounded surface. The curved major surface of the groove is generated by gray-scale mask 50, which has regions of varying opacity to the actinic radiation. The spatial variation in the mask's opacity causes the cladding layer 11 to receive a spatial variation in the dosage of actinic radiation, which in turn causes cladding layer 11 to have a spatial variation in its solubility to the developer. As a result, portions of cladding layer 11 are removed at different rates, and to different depths, the action of which creates a structure with three-dimensional features since there is a significant variation in the thickness of the developed cladding layer.

A top plan view of mask 50 is shown in FIG. 4. Mask 50 has a first area 51 with a length oriented to the propagation axis of waveguide structure 10 and a width for initially defining a groove in which first core segment 31 will be built. Mask 50 also has a second area 52 with a length oriented to the propagation axis of waveguide structure 10 and a width for initially defining a groove in which second core segment 32 will be built. Shown within these areas are thinner, solid lines of constant opacity. Each such line goes through points of the mask that have the same value of opacity; a gradation in opacity occurs between adjacent lines. Each of first and second areas 51 and 52 has a gradation of opacity along its width. In a preferred embodiment, photosensitive cladding layer 11 is a positive type, and the opacities of areas 51 and 52 are at their lowest value (least opaque) at the centers of the widths of the areas, and are at their highest value (most opaque) at the ends of the widths, with gradations from the center to the ends, as indicated in FIG. 4. This causes the centers of the widths to receive greater amounts of actinic radiation than the ends, and generally causes the actinic radiation to penetrate more deeply down into the layer at the centers than at the ends.

In addition, second area 52 has a secondary gradation in opacity along its length to effect the flare in the height of second core segment 32 (i.e., to cause the groove for core segment 32 to go deeper). In the preferred embodiments using positive type photosensitive material, the opacity of second area 52 decreases as one moves along its length from area 51 to the right edge of the mask. In other words, the left edge of second area 52 has the same opacity values as the right edge of first area 51, and the opacity values of second area 52 decrease as one moves to the right and away from first area 51.

Construction of gray-scale masks is well known to the art, and a description thereof is not necessary for one of ordinary skill in the art to make and use the present invention. In addition, for a particular photosensitive material and exposure time that one of ordinary skill in the art may want to use, the ability to select the gradation values of gray-scale mask 50 and to select the actinic radiation power level to achieve a desired patterned structure is well within the ordinary skill in the art in view of the present specification. As one basic approach, one may construct several test versions of areas 51 and 52 on a gray-scale mask, with the test versions having different degrees of minimum opacity, maximum opacity, and gradations of opacity. One may then review the results and interpolate among the results to construct areas 51 and 52 which will have the desired results. Further iterations on this approach are, of course, possible. The construction and analysis of test versions of mask patterns is part of the usual and normal practice of developing a gray-scale mask, and does not involve undue experimentation.

As the next step, cladding layer 11 is exposed to a developer to form a groove 15 in which core element 30 will be later built. The result is shown in FIG. 5. Groove 15 has a length disposed along the waveguide's propagation axis, and a surface that is curved in a direction transverse to the groove's length. Groove 15 has two segments 16 and 17 in which core segments 31 and 32, respectively, will be built. Each of core segments 31 and 32 has a major curved surface and a lowermost depth that lies between the top and bottom surfaces of lower cladding layer 11. As an optional step, the developed cladding layer 11 may be partially cured and/or desensitized (such as by exposure to heat and elevated temperatures, or to a chemical agent) to reduce its sensitivity to actinic radiation. This process step will reduce the chances of cladding layer 11 having further changes in solubility when the core material is subsequently formed and exposed to actinic radiation. This process step will usually also reduce the chances of cladding layer 11 being dissolved by any fluidizing solvents of the core layer. If not, an optional treatment step to increase the resistance to the fluidizing solvent(s) may be preformed. As indicated above, such treatment steps are known in the art.

Next, as shown in FIG. 6, a core layer 30' of photosensitive core material is formed over groove 15 and the remaining portion of cladding layer 11. This defines and forms the bottom parts of core segments 31 and 32. The top parts are yet to be defined. Like the cladding material, the core layer is dissolvable in a developer (usually a liquid solution or a solvent different from the fluidizing, if used) at a rate that is a function of exposure dosage to actinic radiation. In preferred embodiments, the material of core layer 30' is positive type.

Next, as shown in FIG. 7, photosensitive core layer 30' is exposed to actinic radiation through a second gray-scale mask 60 (i.e., core layer 30' is patterned exposed to actinic radiation) in order to define the top parts of core segments 31 and 32. The top parts are to have curved major surfaces (e.g., rounded surfaces). The curved surfaces are provided by gray-scale mask 60, which has regions of varying opacity to the actinic radiation. The spatial variation in the mask's opacity causes the core layer 30' to receive a spatial variation in the dosage of actinic radiation, which in turn causes core layer 30' to have a spatial variation in its solubility to the developer. As a result, portions of core layer 30' are removed at different rates, and to different depths, which thereby creates a structure with three-dimensional features since there is a significant variation in the thickness of the developed core layer.

A top plan view of mask 60 is shown in FIG. 8. Mask 60 has a first area 61 with a length oriented to the propagation axis of waveguide structure 10 and a width for defining the shape of the top part of first core segment 31. Mask 60 also has a second area 62 with a length oriented to the propagation axis of waveguide structure 10 and a width for defining the shape of the top part of second core segment 32. Shown within these areas are thinner, solid lines of constant opacity. Each such line goes through points of the mask that have the same value of opacity; a gradation in opacity occurs between adjacent lines. Each of first and second areas 61 and 62 has a gradation of opacity along its width. In one set of preferred embodiments, photosensitive core layer 30' is positive type, and the opacity of areas 61 and 62 is at its highest value (most opaque) at the centers of the widths of the areas, and is at its lowest value (least opaque) at the ends of the widths, with gradations from the centers to the ends, as indicated in FIG. 8. This causes the centers of the widths to receive lower amounts of actinic radiation than the ends, and generally causes the actinic radiation to penetrate less deeply down into the layer at the centers than at the ends. This variation in the opacity is opposite to that of the preferred gray-scale mask for cladding layer 11, described above with respect to FIG. 4. Thus, the preferred gray-scale masks shown FIGS. 4 and 8 are substantially complementary to one another in areas 51, 52, 61, and 62.

In addition, second area 62 has a secondary gradation in opacity along its length to effect the flare in the height of second core segment 32. In the preferred embodiments using positive type photosensitive material, the opacity of second area 62 increases as one moves along its length from area 61 to the right edge of the mask. In other words, the left edge of second area 62 has the same opacity values as the right edge of first area 61, and the opacity values of second area 62 increase as one moves to the right and away from first area 61.

For a particular photo-sensitive material and exposure times that one of ordinary skill in the art may want to use, the ability to select the gradation values of gray-scale mask 60 and to select the actinic radiation power level to achieve a desired patterned structure is well within the ordinary skill in the art in view of the present specification. As one basic approach, one may use the interpolation method outlined above for gray-scale mask 50.

As the next step, core layer 30' is exposed to a developer, the result of which is shown in FIG. 9. The combination pattern exposure and development creates a core element with a circular or oval cross-section, having a curved top major surface and a curved bottom major surface. To complete the waveguide structure, an upper-cladding layer 20 may be formed over core element 30 and the exposed parts of lower cladding layer 11. Upper-cladding layer 20 need not comprise a photo-sensitive material. The entire structure is then fully cured, if so required by the materials. The result of this is shown in FIG. 1.

Prior to forming upper cladding layer 20, core element 30 may be partially cured or otherwise to prevent solvents in the fluidized form of cladding layer 20 from partially dissolving core element 30. A photosensitive material, particularly a positive-type photosensitive material, generally comprises a major portion of a non-photosensitive polymer material, and a minor portion of a photo-active compound that provides the material with its photo-sensitivity. The curing step, if used, generally causes the photo-active compound to decompose to a non-photosensitive component, which is referred to herein as a decomposed photo-active compound. The steps mentioned above for desensitizing the photosensitive materials to actinic radiation can also cause the photo-active compound to decompose to a decomposed photo-active compound. In some cases, not all of the photo-active compound is decomposed by a curing step or a desensitizing step. Thus, after the waveguide structure is formed, the lower cladding layer and the core elements may each comprise an amount of the photo-active compound, and/or an amount of the decomposed photo-active compound.

The process of defining the waveguide's core element with photosensitive core and lower cladding layers has the following advantages. First, the side walls of the groove and core element can be made more smooth in comparison to the case where these features are defined by an anisotropic etching process using a three-dimensional photoresist layer. For polymer materials, such anisotropic etching processes usually involve the use of an energetic plasma, which can introduce a roughness to the etched surfaces. Such rough surfaces can be sources of light absorption and scattering. In contrast, the development of a pattern exposed photosensitive layer produces a smoother surface, particularly when followed by a soft-baking step. In addition, plasma etching can change the chemical composition of the etch surface and can contaminate portions of the etched surface with by-products of the decomposition of the photoresist mask. This contamination can also create sources of light absorption and scattering. In contrast, the development of a pattern exposed photosensitive layer does not contaminate the side walls with decomposed by-products.

A wide variety of photosensitive core and cladding materials are commercially available and/or described in the patent and technical literature, and these may be used in practicing the present invention. In addition, polymer materials not normally considered for use in optical applications may be used, such as photosensitive polyimides conventionally used as intermetallic dielectric layers in integrated-circuit chip and multi-chip module applications, particularly fluorinated polymers (e.g., fluorinated polyimides) which have high degrees of transparency. As one approach to materials selection, one may use a base photosensitive polymer material for one of the cladding and core layers, and a combination of the base polymer material with a minor addition (less than 50% by weight) of a different (but compatible) polymer material for the other one of the cladding and core layers. The different polymer material is selected such that its addition to the base polymer material causes the combined material to have a different index of refraction (either higher or lower) than that of the base polymer material. In general, the index of refraction of a polymer material is related to the density of the material (generally increasing with increasing density). Accordingly, as one option, one may select the additional polymer material to have a different density from that of the base polymer material. The selection of compatible materials to achieve the difference in refractive indices is well within the ordinary skill of the art.

As examples, one can use low-loss polymers from the following companies: Nitto Denko (photosensitive polyimide), Hitachi Chemical Co., Ltd. (OPGUIDE and/or OPI Series), NTT Advanced Technology; (the FL-01, CB-M, CB-L fluorinated polyimide systems), and Nippon Steel Chemical (the V-259PH,EH photosensitive epoxy products), A second waveguide structure according to the present invention is shown at 100 in FIG. 10. Waveguide structure 100 is formed on a substrate 1 and comprises a lower cladding layer 11, a core element 130 partially embedded in lower cladding layer 11, and an upper cladding layer 20 which covers the exposed portions of core element 130 and lower cladding layer 11.

Core element 130 comprises a first core segment 131 and a second core segment 132 optically coupled to first core segment 131. First core segment 131 may have substantially the same form as that of core segment 31 described above (e.g., a circular or oval-shaped cross-section), except that it is formed more deeply into cladding layer 11. Second core segment 132 comprises an elbow-bend segment, which is a short segment of waveguide similar to that of core segment 131, but with a 90-degree bend in it (e.g., a cylindrical tube with a 90-degree bend). FIG. 11 shows a side view of waveguide structure, showing the locations of core segments 131 and 132 within cladding layer 11.

When the radius of curvature of the 90-degree bend is 15 μm or less, there can be a measurable amount of loss for light traveling around the bend. To reduce such loss, a reflective metal layer 135 may be formed on the bottom curved surface of the bend, and shown in FIG. 11. In preferred embodiments, metal film 135 comprises gold.

Like waveguide structure 10, waveguide structure 100 is generally designed to convey light having a wavelength in the range of approximately 700 nm to approximately 1600 nm. Waveguides 100 and 10 may be formed together on the same substrate.

Waveguide 100 may be formed by the same above-described steps for forming waveguide structure 10, except that different patterns on the gray-scale masks are used, and an extra process step is included to form metal layer 135, if used. For the sake of brevity, the above steps for forming waveguide structure 10 are incorporated herein by reference for the forming of waveguide structure 100. FIG. 12 shows a top plan view of an exemplary gray-scale mask 150 that may be used to pattern cladding layer 11 for forming waveguide structure 100. Mask 150 has a first area 151 with a length oriented to the propagation axis of waveguide structure 100 and a width for initially defining a groove in which first core segment 131 will be built. Mask 150 also has a second area 152 with a length oriented to the propagation axis of waveguide structure 100 and a width for initially defining a groove in which second core segment 132 will be built. Shown within these areas are thinner, solid lines of constant opacity. Each such line goes through points of the mask that have the same value of opacity; a gradation in opacity occurs between adjacent lines. Each of first and second areas 151 and 152 has a gradation of opacity along its width. In preferred embodiments, photosensitive cladding layer 11 is of positive type, and the opacities of areas 151 and 152 are at their lowest value (least opaque) at the centers of the widths of the areas, and are at their highest value (most opaque) at the ends of the widths, with gradations from the center to the ends, as indicated in FIG. 12. This causes the centers of the widths to receive greater amounts of actinic radiation than the ends of the widths, and generally causes the actinic radiation to penetrate more deeply down into the layer at the centers than at the ends.

In addition, second area 152 has a secondary gradation in opacity at its right end to effect the bottom rounding of the elbow bend in core segment 132. This gradation is radial in form, as shown by the lines of constant opacity in FIG. 12. In the preferred embodiments using positive type photosensitive material, the opacity of second area 152 decreases as one moves outward from a distal point 153 to the area right of distal point 153, as shown in FIG. 12.

FIG. 13 shows a top plan view of an exemplary gray-scale mask 160 that may be used to pattern core layer 30' in the construction of waveguide structure 100 (core segments 131 and 132 are formed from core layer 30' ). Mask 160 has a first area 161 with a length oriented to the propagation axis of waveguide structure 100 and a width for defining the shape of the top part of first core segment 131. Mask 160 also has a second area 162 with a length oriented to the propagation axis of waveguide structure 100 and a width for defining the shape of the top part of second core segment 132 (the elbow-bend). Shown within these areas are thinner, solid lines of constant opacity. Each such line goes through points of the mask that have the same value of opacity; a gradation in opacity occurs between adjacent lines. Each of first and second areas 161 and 162 has a gradation of opacity along its width. In preferred embodiments, photosensitive core layer 30' is positive type, and the opacity of area 161 is at its highest value (most opaque) at the center of its width, and is at its lowest value (least opaque) at the end of its width, with gradations from the center to the end, as indicated in FIG. 12. This causes the center of the width to receive lower amounts of actinic radiation than the ends, and generally causes the actinic radiation to penetrate less deeply into the layer at the centers than at the ends.

The variation in the opacity in second area 162 is more complex. The left side of area 162 matches the opacity profile of area 161, with the lines of constant opacity at the left side of area 162 matching those at the right side of area 161. At the right side of area 162, there is a large circle or oval of high opacity, preferably constant opacity, which is for defining the vertical section of core segment 132. The opacity of this circle is higher than the maximum opacity in area 161 used for defining the top of core segment 131. This difference in opacity enables one to create a difference in height between the top end of core segment 132 and the top of core segment 131. Finally, the lines of constant opacity in area 162 flare out as they go from left to right, in order to define the top curved surface of core segment 132.

Steps for forming metal layer 135 may be performed at a time after layer 11 has been patterned and before layer 20 is formed. In this case, a photoresist layer is formed over layer 11, and is defined to open a window over the location where metal layer 135 is to be formed. Thereafter, one or more metal layers are sputtered, deposited, or otherwise formed over the masked substrate. Typically, a metal adhesion layer is first formed (e.g., chromium), followed by a reflective metal (e.g., gold). Thereafter the photoresist layer is striped, and the processing continues with the formation steps outlined above for forming layer 20.

FIG. 14 shows a side-by-side comparison of the cross-sections of the grooves 16 and 116 formed in cladding layer 11 for core segments 31 and 131, respectively. FIG. 14 shows the cross-sections after cladding layer 11 has been pattern exposed to actinic radiation and subsequently exposed to the developer. As can be seen, groove 116 is deeper than groove 16, and the side walls of groove 116 have portions near the top surface of layer 11 which are substantially vertical, rather than curved. FIG. 15 shows a side-by-side comparison of the cross-sections of waveguide devices 10 and 100 after core layer 30' has been formed and pattern exposed to actinic radiation through gray-scale masks 60 and 160, respectively. The exposure depth for each of these structures is shown by lines 65 and 165. For waveguide structure 100, the exposure depth penetrates a small distance into cladding layer 11. There may be a loss of the top portion of cladding layer 11 because of this penetration, but the loss will be replaced by the subsequent formation of upper cladding layer 20. Also, the small difference between the indices of refraction for layers 11 and 30' is not expected to cause an undesired refractive effect during the pattern exposure to actinic radiation.

As indicated above, waveguide cores with oval cross-sections as well as circular cross-sections may be formed. FIG. 16 shows two exemplary oval core cross-sections at 30A and 30B. These cross-sections may be readily achieved by the selection of the gradations in gray-scale masks 50, 60, 150, and 160.

FIG. 17 shows an interconnect application 200 in which both waveguide structures 10 and 100 may be formed and used together on a substrate 1. Substrate 1 comprises several wiring planes 202 and vertical electrical interconnects 204 that electrically interconnect a plurality of integrated circuit (IC) chips 220. Electrical pads of the chips 220 are electrically coupled to vertical interconnects 204 by respective solder bumps 214. An optical interconnect layer 210 is formed over the top surface of substrate 1, with vertical interconnects 204 being integrally formed into optical interconnect layer 210 in order to pass vertically through the layer. An instance of waveguide structure 10 and three instances of waveguide 100 within optical interconnect layer 210 are shown in FIG. 17. As such, optical interconnect layer comprises a lower cladding layer, an upper cladding layer, and several core elements disposed between the cladding layers. At one of its ends, waveguide structure 10 is optically coupled to an optical fiber 5 through a surface-mount holder 205. At its other end, waveguide structure 10 is optically coupled to an instance of waveguide structure 100, which in turn is optically coupled to a portion of IC chip 220 by a ball of "optical glue." The portion of the IC chip has an opto-electronic device 225 disposed at the surface of the chip to either receive or transmit an optical signal. Optical glue is well known to the art, and comprises a flexible, clear polymer material which has an index of refraction close to that of the core material. Exact equality in the indices of refraction is not needed since the light travels in a direction which is perpendicular to the junction between the end of waveguide 100 and the ball of optical glue. Also shown are two instances of waveguide 100 which are optically coupled together at their second core segments 132. The other ends of these waveguides are optically couple to portions of the leftmost and right most IC chips 220, through respective balls of optical glue. For receiving an optical signal, opto-electronic device 225 may comprise a photodetector; for transmitting an optical signal, opto-electronic device 225 may comprise a vertical cavity emitting laser (VCSEL).

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of forming a substrate optical waveguide having a propagation axis along which light is conveyed, a cladding layer, and a core element, the core element having an elongated dimension collinear with the waveguide's propagation axis and a transverse cross-section transverse to the elongated dimension, the method comprising the steps of:
   (a) forming a lower cladding layer of positive-type photosensitive cladding material;
   (b) exposing the cladding layer to actinic radiation through a first gray-scale mask;
   (c) developing the exposed pattern to form a groove located in the lower cladding layer and having three-dimensional features, the remaining portion of the lower cladding layer still being sensitive to actinic radiation;
   (d) thereafter treating the developed lower cladding layer to reduce its sensitivity to actinic radiation;
   (e) thereafter forming a core layer of photosensitive core material over the groove and the treated lower cladding layer;
   (f) exposing the core layer to actinic radiation through a second gray-scale mask; and
   (g) developing the exposed pattern to form an element of core material located over the groove and having three-dimensional features.

2. The method of claim 1 wherein the photosensitive core material is positive type.

3. The method of claim 1 further comprising the step of forming an upper cladding layer over the exposed portions of the core element and lower cladding layer.

4. The method of claim 1 wherein step (d) comprises at least partially curing the lower cladding layer.

5. The method of claim 1 wherein the element of core material has a circular cross-section in a plane transverse to the waveguide's propagation axis.

6. The method of claim 1 wherein the element of core material has an oval-shaped cross-section in a plane transverse to the waveguide's propagation axis.

7. The method of claim 1 wherein the element of core material has top and bottom surface portions which are curved.

8. The method of claim 1 wherein each of the cladding and core materials comprises a common base photosensitive polymer material, and wherein one of the cladding and core materials comprises a minor addition of a different polymer material.

9. A method of forming a substrate optical waveguide having a propagation axis along which light is conveyed, a cladding layer, and a core element, the core element having an elongated dimension collinear with the waveguide's propagation axis and a transverse cross-section transverse to the elongated dimension, the method comprising the steps of:
   (a) forming a cladding layer of a positive-type photosensitive cladding material on a substrate, the solubility of the cladding material in a developer being a function of exposure dosage to actinic radiation;
   (b) pattern exposing the cladding layer to actinic radiation through a first gray-scale mask, the first gray-scale mask comprising a first area for defining a first segment of the core element, the first area having a length oriented to the propagation axis of the waveguide and a width for initially defining the transverse cross-section of the core element in the first segment, the first area of the first gray-scale mask having a gradation of opacity along its width;
   (c) thereafter exposing the cladding layer to a developer to form a groove in the layer of photosensitive cladding material, the remaining portion of the lower cladding layer still being sensitive to actinic radiation, the groove having a first segment with a length disposed along the waveguide's propagation axis and a major curved surface which is curved in a direction transverse to the length of the grooves first segment;

(d) thereafter treating the developed lower cladding layer to reduce its sensitivity to actinic radiation;

(e) thereafter forming a core layer of a photosensitive core material over the groove and the treated cladding layer, the solubility of the core material in a developer being a function of exposure dosage to actinic radiation;

(f) pattern exposing the core layer to actinic radiation through a second gray-scale mask, the second gray-scale mask comprising a first area for further defining the first segment of the waveguide's core element, the first area having a length oriented to the propagation axis of the waveguide and a width for further defining the transverse cross-section of the core element in the first segment, the first area of the second gray-scale mask having a gradation of opacity in the direction of its width; and (g) thereafter exposing the core layer to a developer to form the first segment of the waveguide's core element.

10. The method of claim 9, wherein the first gray-scale mask of step (b) further comprises a second area for defining a second segment of the core element, the second area having a length oriented to the propagation axis of the waveguide and a width for initially defining the transverse cross-section of the second segment of the core element, the second area of the first gray-scale mask having a first gradation of opacity along its width and a second gradation of opacity along its length;

wherein step (c) of exposing the cladding layer to a developer further forms the groove with a second segment with a length disposed along the waveguide's propagation axis and a major surface which is curved in a direction transverse to the length of the groove's second segment, the groove's second segment having a gradation in its width and a gradation in its depth;

wherein step (e) of forming the core layer further forms the photosensitive core material over the second segment of the groove;

wherein the second gray-scale mask of step (f) further comprises a second area for further defining the second segment of the waveguide's core element, the second area having a length oriented to the propagation axis of the waveguide and a width for further defining the transverse cross-section of the core element in the second segment, the second area of the second gray-scale mask having a first gradation of opacity in the direction of its width and a second gradation of opacity along its length; and wherein step (g) of exposing the core layer to a developer further forms the second segment of the waveguide's core element.

11. The method of claim 9, wherein the first gray-scale mask of step (b) further comprises a second area for defining a second segment of the core element, the second area having a length oriented to the propagation axis of the waveguide and a width for initially defining the transverse cross-section of the second segment of the core element, the second area of the first gray-scale mask having a first portion with a first gradation of opacity along its width and a second portion with a radial gradation of opacity about a point;

wherein step (c) of exposing the cladding layer to a developer further forms the groove with a second segment with a length disposed along the waveguide's propagation axis and a major surface which is curved in a direction transverse to the length of the groove's second segment, the major surface of the groove's second segment further having a portion which is curved in the direction of the length of the groove's second segment;

wherein step (e) of forming the core layer further forms the photosensitive core material over the second segment of the groove;

wherein the second gray-scale mask of step (f) further comprises a second area for further defining the second segment of the waveguide's core element, the second area having a length oriented to the propagation axis of the waveguide and a width for further defining the transverse cross-section of the core element in the second segment, the second area of the second gray-scale mask further having a first portion with a gradation of opacity in the direction of the second area's width and a second portion having a circle or oval of constant opacity; and wherein step (g) of exposing the core layer to a developer further forms the second segment of the waveguide's core element.

12. The method of claim 11 further comprising, between the performance of steps (c) and (e), the step of forming a layer of reflective metal on the bottom surface of the groove's second segment.

13. The method of claim 9 wherein the photosensitive core material is positive type.

14. The method of claim 9 further comprising the step of forming an upper cladding layer over the exposed portions of the core element and lower cladding layer.

15. The method of claim 9 wherein step (d) comprises at least partially curing the lower cladding layer.

16. The method of claim 9 wherein the element of core material has a circular cross-section in a plane transverse to the waveguide's propagation axis.

17. The method of claim 9 wherein the element of core material has an oval-shaped cross-section in a plane transverse to the waveguide's propagation axis.

18. The method of claim 9 wherein the element of core material has top and bottom surface portions which are curved.

19. The method of claim 9 wherein each of the cladding and core materials comprises a common base photosensitive polymer material, and wherein one of the cladding and core materials comprises a minor addition of a different polymer material.

20. A method of forming a substrate optical waveguide having a propagation axis along which light is conveyed, a cladding layer, and a core element, the core element having an elongated dimension collinear with the waveguide's propagation axis and a transverse cross-section transverse to the elongated dimension, the method comprising the steps of:

(a) forming a cladding layer of a photosensitive cladding material on a substrate, the solubility of the cladding material in a developer being a function of exposure dosage to actinic radiation;

(b) pattern exposing the cladding layer to actinic radiation through a first gray-scale mask, the first gray-scale mask comprising a first area for defining a first segment of the core element and a second area for defining a second segment of the core element, the first area having a length oriented to the propagation axis of the waveguide and a width for initially defining the transverse cross-section of the core element in the first segment, the first area of the first gray-scale mask having a gradation of opacity along its width, the second area having a length oriented to the propagation axis of the waveguide and a width for initially defining the transverse cross-section of the second segment of the core element, the second area of the first gray-scale mask having a first portion with a first gradation of opacity along its width and a second portion with a radial gradation of opacity about a point;

(c) thereafter exposing the cladding layer to a developer to form a groove in the layer of photosensitive cladding material, the groove having a first segment with a length disposed along the waveguide's propagation axis and a major curved surface which is curved in a direction transverse to the length of the grooves first segment, the groove further having a second segment with a length disposed along the waveguide's propagation axis and a major surface which is curved in a direction transverse to the length of the groove's second segment, the major surface of the groove's second segment further having a portion which is curved in the direction of the length of the groove's second segment;

(d) forming a core layer of a photosensitive core material over the first and second segments of the groove and over the cladding layer, the solubility of the core material in a developer being a function of exposure dosage to actinic radiation;

(e) pattern exposing the core layer to actinic radiation through a second gray-scale mask, the second gray-scale mask comprising a first area for further defining the first segment of the waveguide's core element and a second area for further defining the second segment of the waveguide's core element, the first area having a length oriented to the propagation axis of the waveguide and a width for further defining the transverse cross-section of the core element in the first segment, the first area of the second gray-scale mask having a gradation of opacity in the direction of its width, the second area having a length oriented to the propagation axis of the waveguide and a width for further defining the transverse cross-section of the core element in the second segment, the second area of the second gray-scale mask further having a first portion with a gradation of opacity in the direction of the second area's width and a second portion having a circle or oval of constant opacity; and (f) thereafter exposing the core layer to a developer to form the first and second segments of the waveguide's core element.

21. The method of claim 20 further comprising, between the performance of steps (c) and (d), the step of forming a layer of reflective metal on the bottom surface of the groove's second segment.

22. The method of claim 20 wherein the photosensitive cladding material is positive type.

23. The method of claim 20 wherein the photosensitive core material is positive type.

24. The method of claim 20 further comprising the step of forming an upper cladding layer over the exposed portions of the core element and lower cladding layer.

25. The method of claim 20 further comprising, after step (c) and prior to step (d), the step of at least partially curing the lower cladding layer.

26. The method of claim 20 further comprising, after step (c) and prior to step (d), the step of reducing the sensitivity of the lower cladding layer to the actinic radiation used in step (e).

27. The method of claim 20 wherein the element of core material has a circular cross-section in a plane transverse to the waveguide's propagation axis.

28. The method of claim 20 wherein the element of core material has an oval-shaped cross-section in a plane transverse to the waveguide's propagation axis.

29. The method of claim 20 wherein the element of core material has top and bottom surface portions which are curved.

30. The method of claim 20 wherein each of the cladding and core materials comprises a common base photosensitive polymer material, and wherein one of the cladding and core materials comprises a minor addition of a different polymer material.

* * * * *